(12) United States Patent
Hashimoto

(10) Patent No.: US 6,390,842 B1
(45) Date of Patent: May 21, 2002

(54) CARD EDGE CONNECTOR WITH DEFLECTIVE LATCH MEMBERS

(75) Inventor: Shinichi Hashimoto, Tokyo (JP)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/236,059

(22) Filed: Jan. 22, 1999

(30) Foreign Application Priority Data

Jan. 29, 1998 (JP) .......................................... 10-032160

(51) Int. Cl.[7] .............................................. H01R 13/62
(52) U.S. Cl. ...................................................... 439/326
(58) Field of Search ................................ 439/327, 328, 439/62, 629, 64, 95, 108, 326

(56) References Cited

U.S. PATENT DOCUMENTS

| | | | |
|---|---|---|---|
| 3,216,580 A | * 11/1965 | Flicker | 439/328 |
| 5,112,242 A | 5/1992 | Choy et al. | 439/326 |
| 5,161,994 A | 11/1992 | Sato et al. | 439/326 |
| 5,161,995 A | 11/1992 | Bakke et al. | 439/326 |
| 5,169,333 A | 12/1992 | Yang Lee | 439/326 |
| 5,209,675 A | 5/1993 | Korsunsky | 439/326 |
| 5,234,354 A | 8/1993 | Smart | 439/326 |
| 5,244,403 A | 9/1993 | Smith et al. | 439/326 |
| 5,286,217 A | 2/1994 | Liu et al. | 439/326 |
| 5,395,262 A | 3/1995 | Lwee | 439/326 |
| 5,413,496 A | 5/1995 | Yu | 439/326 |
| 5,516,304 A | 5/1996 | Yu | 439/326 |
| 5,730,614 A | 3/1998 | Yu | 439/326 |
| 5,791,925 A | * 8/1998 | Yu | 439/326 |
| 5,803,761 A | 9/1998 | Mochizuki | 439/326 |
| 5,997,332 A | * 12/1999 | Choy | 439/328 |

FOREIGN PATENT DOCUMENTS

WO    WO 97/03484    * 1/1997

OTHER PUBLICATIONS

Japanese Patent Abstract 09–82429.
Japanese Utility Model Registration No. 3015081.
Japanese Patent Abstract No. 11–214072; Jan. 1998.

* cited by examiner

*Primary Examiner*—Khiem Nguyen
*Assistant Examiner*—Javaid Nasri

(57) ABSTRACT

The present invention provides a compact latch-equipped connector, which allows accurate accommodation and holding of circuit boards, and which can insure stable holding of circuit boards therein. The latch-equipped connector has metal latch members (20) in positions at both ends of a long, slender housing (11). The latch members (20) have board-engaging sections (31) for engaging with recesses of the circuit board as it is pivoted into a connected position in order to prevent the circuit board from slipping out, and board-holding sections (32) for holding the circuit board inside the housing. The board-holding sections (32) have inclined portions (36) effecting smooth accommodation of the circuit board in the connector. Board-positioning sections (26) are disposed in positions removed from the board-engaging sections (31), and projections (37) are disposed on upper ends of the board-engaging sections (31). In cases where the circuit board is not positioned in the correct position, the accommodation of the circuit board is prevented by the projections (37).

42 Claims, 6 Drawing Sheets

CARD EDGE CONNECTOR WITH DEFLECTIVE LATCH MEMBERS

FIELD OF THE INVENTION

The present invention relates to an electrical connector which can accommodate memory circuit boards used as memory modules mainly in computers, and it relates to a latch-equipped electrical connector which includes a latching means that can fasten circuit boards in place thereto.

BACKGROUND OF THE INVENTION

One example of a latch-equipped electrical connector is disclosed in Japanese Utility Model Registration No. 3015081. The connector accommodates memory circuit boards which have cut-outs or recesses located in the side edges. The latch members are made of metal, and they are disposed inside cavities on inside surfaces of arms located in the vicinity of both ends of a housing. The latch members have engaging sections, which protrude in order to allow engagement along the recesses in the circuit board, and stop sections, which prevent the circuit board from slipping out; the stop sections are positioned at upper ends of the latch members. This connector suffers from two problems. The first problem concerns the reliability of the accommodation and holding of the circuit board in place. Specifically, in the connector disclosed in the abovementioned Utility Model Registration, the connector has a structure which allows flexing of the latch members even in cases where the cut-outs in the circuit board are not accurately aligned with the engaging sections of the latch members at the time of accommodation within the connector. Accordingly, there is a danger that the latch members will be deformed as a result of the cut-outs not being accurately aligned with the engaging sections so that the circuit board cannot be properly held within the connector. Furthermore, the engaging sections and stop sections are at the same location, and the engaging sections engage along the side edges of the cut-outs, so that the holding strength following accommodation within the connector is relatively weak. The second problem is the width dimension of the connector. Since the arms must be formed on the housing, the housing is relatively large; accordingly, relatively large mounting dimensions are required.

A latch-equipped connector which solves the second problem is disclosed in Japanese Patent Application No. 9-82429. The connector disclosed therein has a long, slender housing and metal latch members which are fastened in positions near both ends of the housing. In this connector, the width dimension is small, since no arms are formed on the housing; accordingly, this connector offers the advantage of requiring a relatively small mounting area. In particular, it should be noted that since no arms are present on the housing, board-positioning members, which guide the accommodation of the circuit board and determine the accommodated position when the circuit board is accommodated within the connector, are formed as integral parts of the latch members.

In recent years, there has been a demand for a latch-equipped connector with even smaller mounting dimensions than those of the connector disclosed in Japanese Patent Application No. 9-82429. In such a connector, there is especially a need for a further reduction in dimensions in the direction of length of the latch members.

SUMMARY OF THE INVENTION

Accordingly, one object of the present invention is to provide a compact latch-equipped electrical connector which allows accurate accommodation and holding of circuit boards within the connector, and which can insure stable holding of circuit boards therein.

Furthermore, another object of the present invention is to provide a latch-equipped electrical connector for memory circuit boards which can minimize the required mounting area for the circuit boards.

The present invention is directed to a latch-equipped electrical connector which has a long, slender housing for accommodating a circuit board having side edges that include cut-outs or recesses, and metal latch members fastened in position near both ends of the housing, and which include board-engaging sections that protrude inward so as to engage with the cut-outs in the accommodated circuit board. And board-holding sections that prevent the circuit board from slipping out. The board-holding sections are positioned more toward the ends of the latch members than the board-engaging sections, and they have inclined portions that are inclined substantially inward, and board-holding portions that are positioned adjacent bottom sides of the inclined portions, and projections, which are placed at at least the height positions of upper ends of the board-holding sections, are located on upper ends of the board-engaging sections.

Furthermore, the board-holding sections have overlapping metal plates, which are constructed so that the board-holding sections are equipped with a board-holding portion extending in a substantially horizontal direction from an upper end of an inside plate, and an inclined portion extending at an inclination from an upper end of an outside plate toward the inside to a position which overlaps with the board-holding portion.

Moreover, the latch members are equipped with solder-connection sections that are fastened to a mother circuit board, board-positioning sections which determine the accommodated position of the circuit board when the circuit board is accommodated, and they are constructed so that the board-positioning sections and the solder-connection sections overlap each other.

BRIEF DESCRIPTION OF THE DRAWINGS

Embodiments of the present invention will now be described by way of example with reference to the accompanying drawings in which:

FIG. 1a is a top plan view, FIG. 1b is a front view of FIG. 1a, and FIG. 1c is a right-side view of FIG. 1a.

FIG. 2a is a view looking in the direction of arrow 2a of FIG. 2b, FIG. 2b is a top plan view of FIG. 2a, FIG. 2c is a view looking in the direction of arrow 2c of FIG. 2b, FIG. 2d is view looking in the direction of arrow 2c of FIG. 2d, and FIG. 2e is a cross-sectional view taken along line 2e—2e in FIG. 2a.

FIG. 3a is a side view, FIG. 3b is a top plan view of FIG. 3a, and FIG. 3c is a view looking in the direction of arrow 3c of FIG. 3a.

FIG. 4a is a side view, FIG. 4b is a top plan view of FIG. 4a, and FIG. 4c is a view looking in the direction of arrow 4c in FIG. 4a.

Figure 5a is a side view, FIG. 5b is a top plan view of Figure 5a, FIG. 5c is a cross-sectional view taken along line 5c—5c in FIG. 5a, and FIG. 5d is a view looking in the direction indicated by arrow 5d in FIG. 5a.

FIG. 6a is a side view, FIG. 6b is a top plan view of FIG. 6a , and FIG. 6c is a view looking in the direction indicated by arrow 6c in FIG. 6a.

FIG. 7a is a side view, FIG. 7b is a top plan view of FIG. 7a , and FIG. 7c is a view looking in the direction indicated by arrow 7c in FIG. 7a.

FIG. 8a is a side view, FIG. 8b is a top plan view of FIG. 8a , and FIG. 8c is a view looking in the direction indicated by arrow 8c in FIG. 8a.

FIG. 9a is a side view, FIG. 9b is a top plan view of FIG. 9a, and FIG. 9c is a view looking in the direction indicated by arrow 9c in FIG. 9a.

DETAILED DESCRIPTION OF THE INVENTION

Figure 1A:
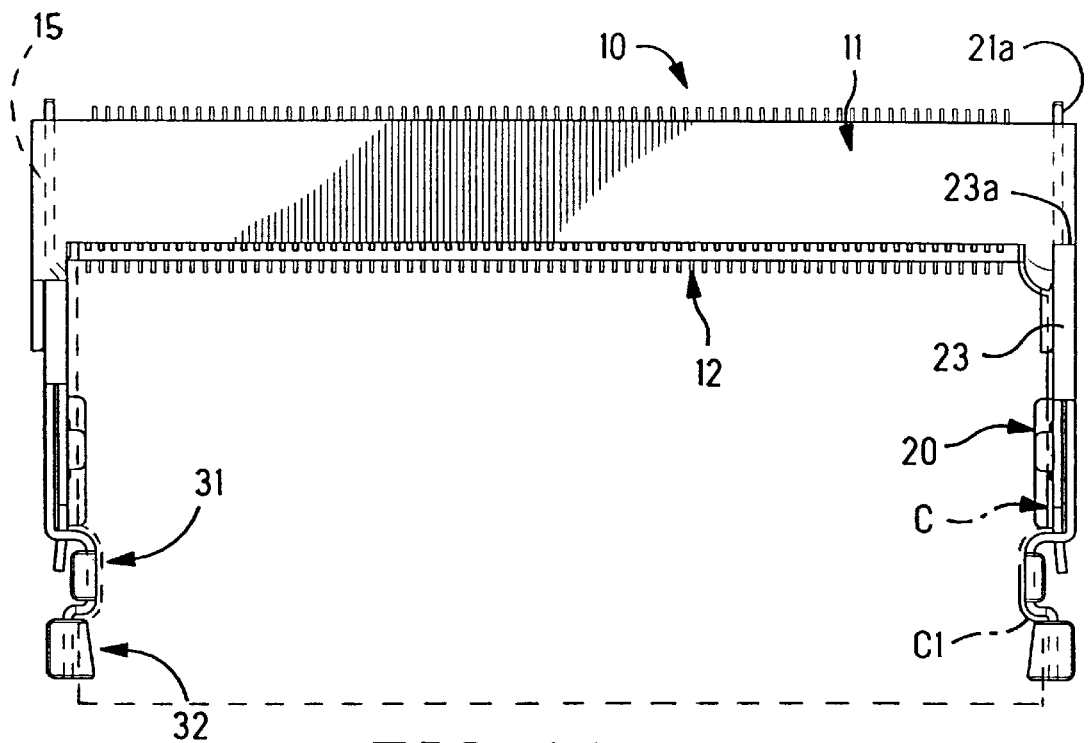
FIGS. 1a–1c illustrate a latch-equipped connector of the present invention.
Figure 1B:
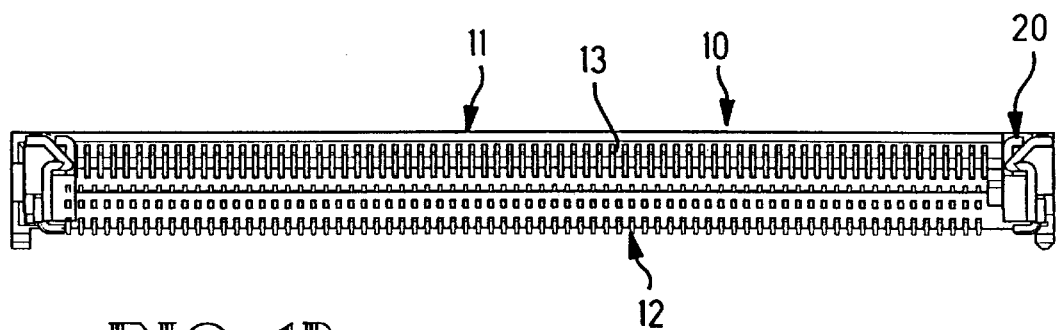
Figure 1C:
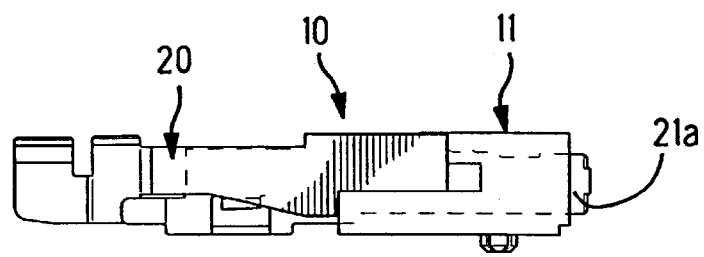

Latch-equipped connector 10 as shown in FIGS. 1a–1chas a long, slender rectangular housing 11 and metal latch members 20, which are positioned at both ends of the housing 11. The housing 11 has a board-accommodating slot 13 in which a plurality of electrical contacts 12 are disposed. A memory circuit board is accommodated and used inside the board-accommodating slot 13. The electrical contacts 12 are arranged in rows so that they electrically engage upper and lower conductive pads of the circuit board (not shown). The latch members 20 are fastened in place by press-fitting in positions near both ends of the housing 11, and they extend in a direction perpendicular to the direction of length of the housing 11.

Figure 2A:
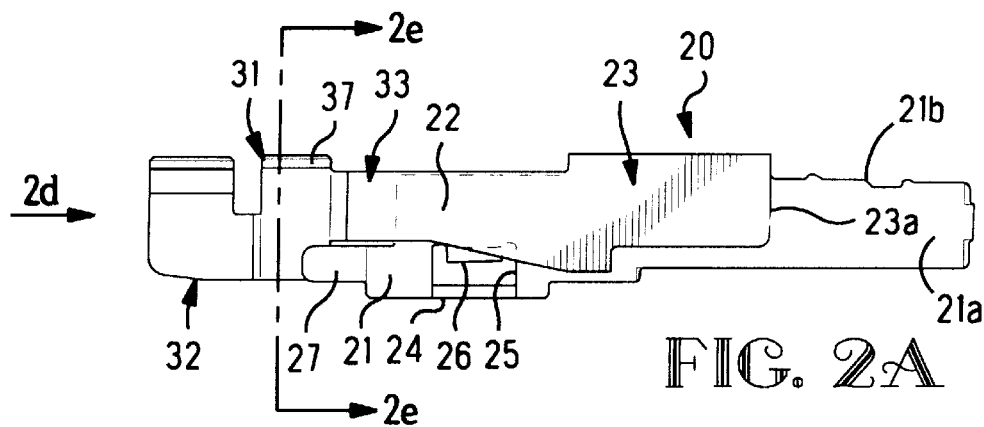
FIGS. 2a–2e show one of the latch members used in the latch-equipped connector shown in FIG. 1.
Figure 2B:
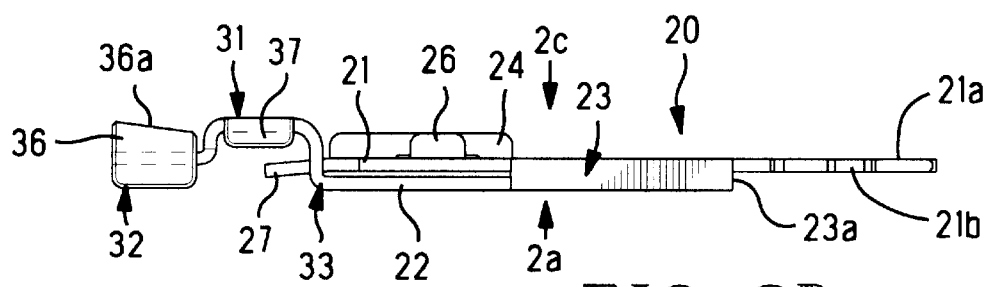
Figure 2C:
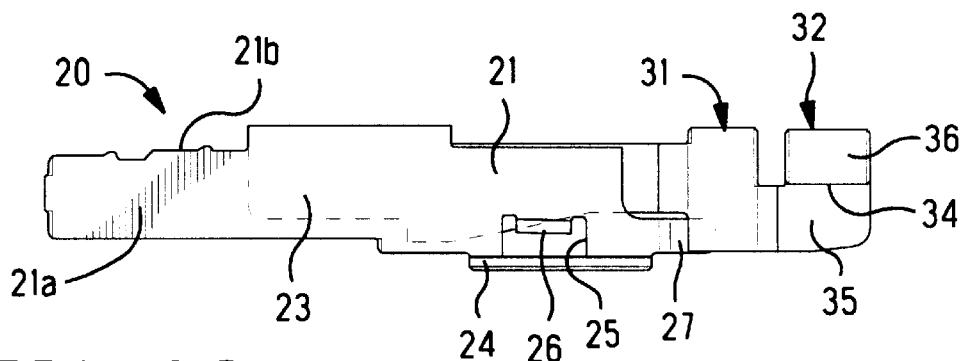
Figure 2D:
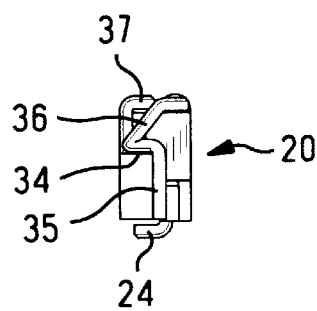
Figure 2E:
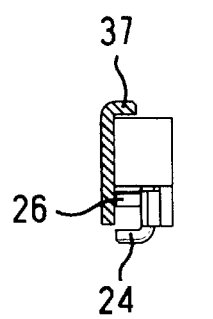

As shown in FIGS. 2a–2e, each latch member 20 has an inner plate 21 and an outer plate 22 which are overlapped in an inward-outward direction by bending of the metal plate from which the latch member is made. Inner end 23a of connecting section 23, where the inner plate 21 and outer plate 22 are connected, engages the housing 11 as shown in FIG. 1a. The inner plate 21 and outer plate 22 extend forwardly from the connecting section 23 independently of each other. The inner plate 21 has an extension 21a that has a serrated surface 21b for press-fitting in slots is at respective ends of housing 11 as shown in FIGS. 1a, 1b. The inner plate 21 has a solder-connection section 24, which is used to fasten the inner plate 21 by soldering to a mother board on which the latch-equipped connector 10 is to be mounted. The solder-connection section 24 is formed by bending the bottom end of the inner plate 21 so that the bottom end extends inward. An opening 25 is formed in the inner plate 21 in a position near the solder-connection section 24. Opening 25 is formed in order to install a board-positioning section 26. During the accommodation of the circuit board, the board-positioning section 26 engages a bottom surface of the circuit board, and it acts to stop further movement of the circuit board from the bottom side thereof. As shown in FIGS. 2a, 2c and 2e, the board-positioning section 26 overlaps with the solder-connection section 24. A tongue 27, which protrudes further toward an outer end of latch members 20, is located at an outer end of the inner plate 21. Tongue 27 extends outward at a slight inclination, and it is positioned so that it overlaps with a board-engaging section 31 located on an extended portion of the outer plate 22. As will be described later, tongue constitutes an overstress-preventing member which prevents excessive displacement of a resilient arm 33 which flexes outward.

The outer plate 22 has resilient arm 33, which includes the board-engaging section 31 described above, and which further includes a board-holding section 32 to hold the board in position. The resilient arm 33 is disposed so that resilient displacement toward the outside is possible. In FIG. 1a, a portion of an end edge of an accommodated circuit board is indicated hypothetically as C; as will be understood from this, board-engaging sections 31 engage with cut-outs or recesses C1 in the side edges of the circuit board. Although not shown, the latch-equipped connector 10 is similar to a conventional connector; the electrical contacts 12 accommodated in the housing 11 are placed so that a rotational moment is applied to the accommodated circuit board, and the connector and circuit board are constructed so that the contacts 12 and conductive pads of the circuit board are caused to make resilient connection so that they are electrically connected to each other as a result of being stopped from an upper surface by the latch members 20.

The board-holding sections 32 include board-holding portions 34, which extend in a horizontal direction in order to stop the pivoting of the circuit board. The holding portions 34 of the board-holding section 32 engage with an upper board surface at positions located behind the cut-outs C1. As seen from FIGS. 2c, 2d, holding portion 34 is formed so that it extends in a horizontal direction from an upright portion 35. Board-holding section 32 also has an inclined portion 36, which is constructed so that it extends toward a top at an inclination from the end of the holding portion 34. As a result of the presence of the inclined portions 36, the circuit board can be smoothly moved and guided so that the circuit board can be moved to a desired position relative to the housing 11.

The holding portions 34 and inclined portions 36 are continuous; accordingly, when a circuit board is accommodated, the circuit board acts on the inclined portions 36 so that the resilient arms 33 are cammed outward. As the accommodation of the circuit board progresses so that the circuit board reaches the desired position against the board-positioning section 26, the engagement between the inclined portions 36 and the circuit board is released and the board-holding portions 34 automatically engage with the upper surface of the circuit board; as a result, the circuit board is held within the connector without any danger of slipping out. The following point should be noted: i.e., as shown in FIG. 2b, edges 36a of the inclined portions 36 extend at an inclination in the direction of length of the latch members 20, so that the accommodation of the circuit board can be accomplished more smoothly. The inclined portions 36 also act as operating members for the removal of the circuit board. Specifically, a worker removing the circuit board places his fingers on the inclined portions 36 and presses them outward. As a result, the engagement of the board-holding portions 34 and the circuit board is released, so that the circuit board rises upward as a result of rotational moment, so that the worker can easily remove the circuit board from the connector.

Furthermore, as shown in FIGS. 2a, 2b, 2c, 2d, a projection 37 is bent outward from an upper end of engaging section 31. Projections 37 prevent accommodation of the circuit board when the accommodation position of the circuit board is not correct. Specifically, in cases where the position of the circuit board is incorrect, portions of the circuit board engage the projections 37 so that accommodation of the circuit board can be prevented. The following should be noted: i.e., the projections 37 are located in positions which are as high as or higher than the upper end positions of the inclined portions 36; accordingly, when a circuit board which is not in the correct position engages the projections 37, the circuit board does not engage the inclined portions 36, so that the resilient arms 33 are not displaced; thus, the circuit board cannot be accommodated in the connector.

The effect of the latch-equipped connector 10 of the embodiment of FIGS. 1a–1c and 2a–2e will be understood by the joint actions of the members described above. First of all, in latch-equipped connector 10, the board-holding sections 32, which are positioned at the ends of the board-engaging sections 31 of the latch members 20 allow smooth accommodation of a circuit board; at the same time, the projections 37 of the board-engaging sections 31 prevent accommodation in cases where the circuit board is in an incorrect position. Accordingly, the operation of accommodating circuit boards can be performed smoothly and reliably; furthermore, following accommodation, the circuit board is securely held by the board-holding portions 34 of the board-holding sections 32. In addition, the inclined portions 36 also act as operating members for the removal of the circuit board from the connector, and the solder-connection sections 24 and board-positioning sections 26 are overlapped in the direction of length, so that the mounting area required for the latch-equipped connector 10 can be minimized.

In the description of the embodiment of FIG. 3a–3c, the housing is the same as that in the embodiment of FIGS. 1a–1c, and the pair of latch members 120 have mirror-symmetrical constructions; accordingly, only one latch member will be described.

Figure 3A:
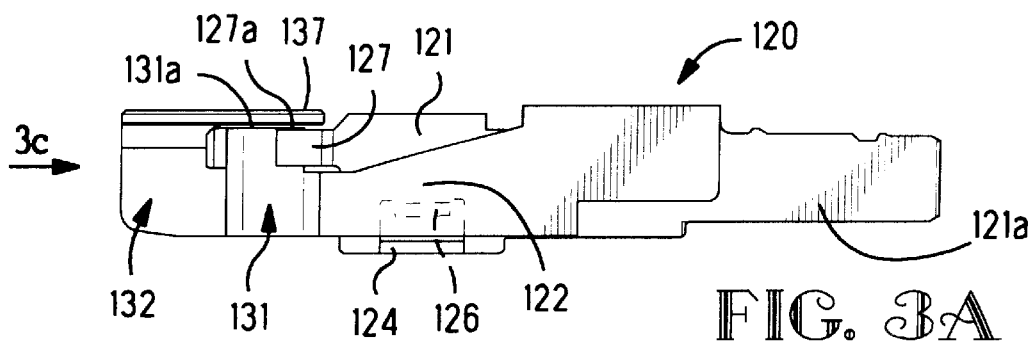
FIGS. 3a–3c illustrate an embodiment of the latch members of a latch-equipped connector of the present invention.
Figure 3B:
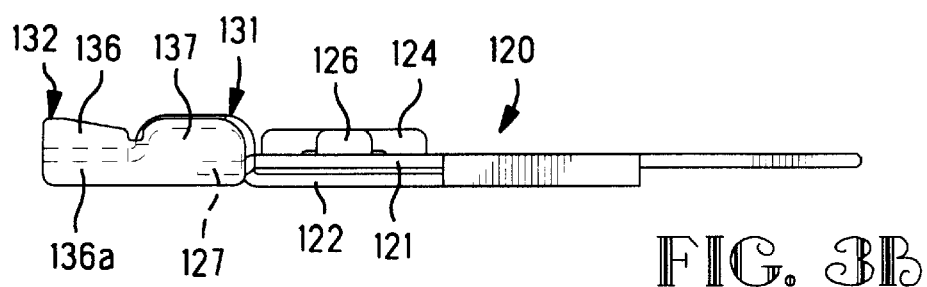
Figure 3C:
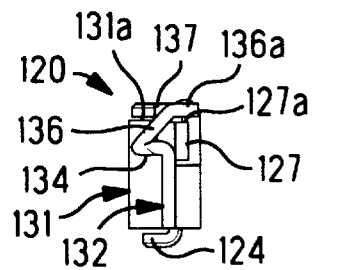

In the second embodiment shown in FIGS. 3a–3c, the difference between the latch member 120 and the latch member 20 shown in the first embodiment is that the projection 137, which prevents accommodation when the circuit board is in an incorrect position, is formed so that projection 137 extends from an upper end 136a of the inclined portion 136. As a result, since the area of the projection 137 is broadened, more precise positioning of the circuit board is possible. The projection 137 is located in close proximity to an upper end 131a of the board-engaging section 131 and an upper surface 127a of the tongue 127 which extends from the vicinity of an upper end of the plate 121 and which is used to realize an anti-overstress structure. Accordingly, when a force is applied to the projection 137 from above, a bottom surface of the projection 137 can be supported by substantial contact with the upper end 131a and upper end 127a. Furthermore, other members, which have the same actions as members in the first embodiment, are labeled by adding "1" to the beginning of the reference number.

Figure 4C:
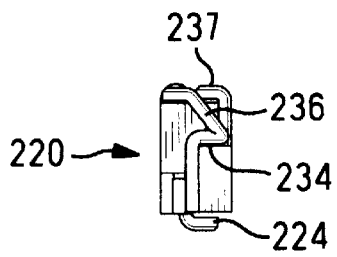
FIGS. 4a–4c illustrate another embodiment of the latch members of a latch-equipped connector of the present invention.
Figure 4A:
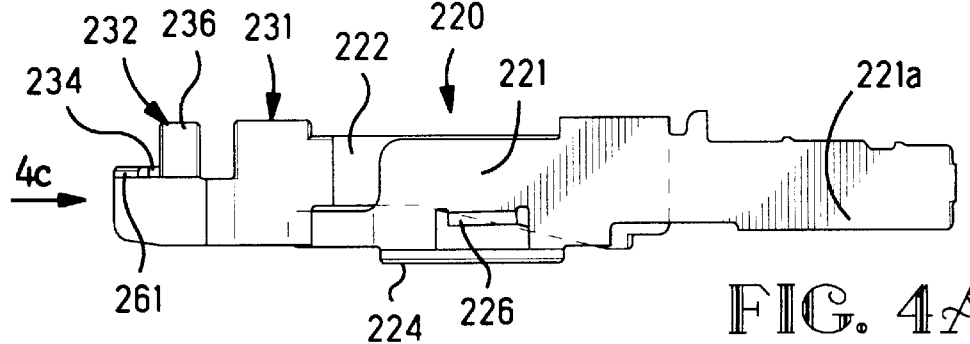
Figure 4B:
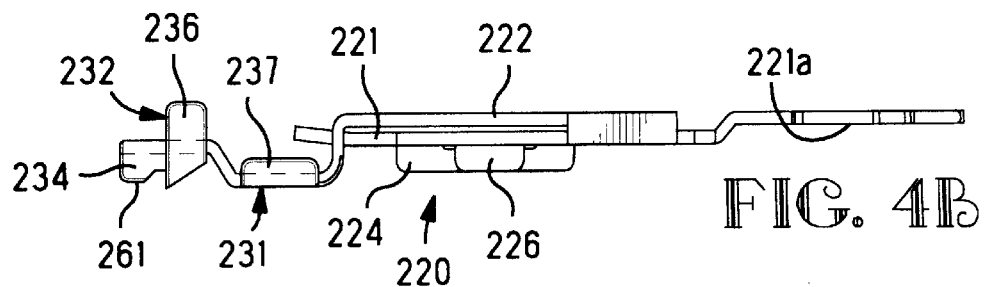
Figure 5A:
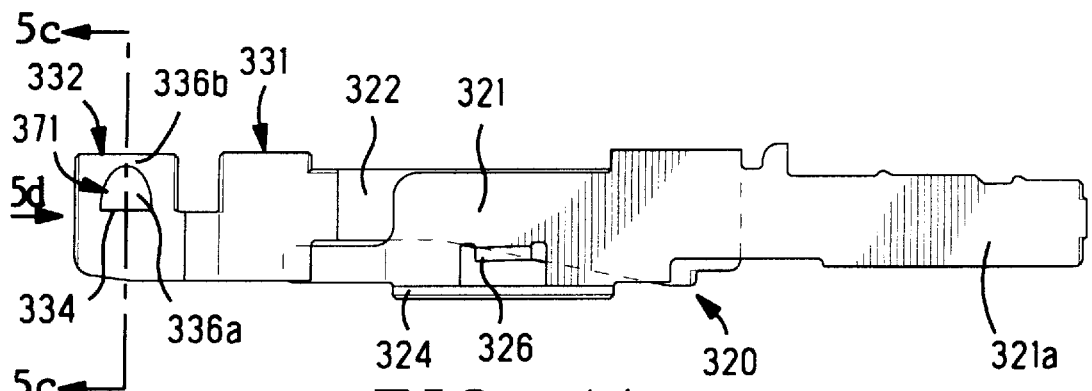
FIGS. 5a–5d illustrate a further embodiment of the latch members of a latch-equipped connector of the present invention.
Figure 5B:
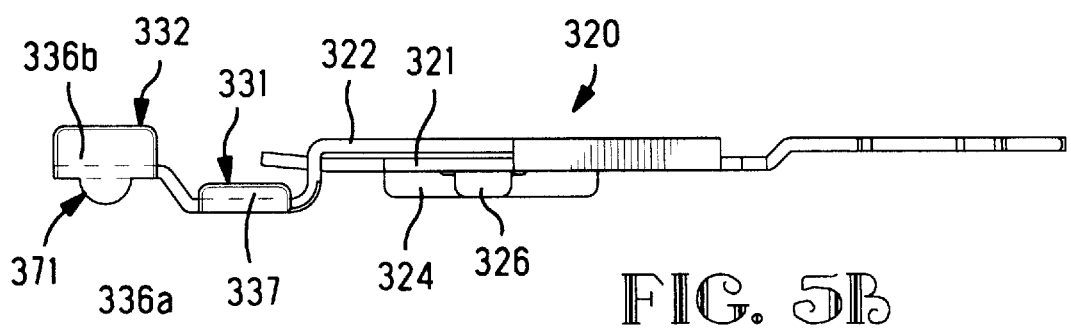
Figure 5C:
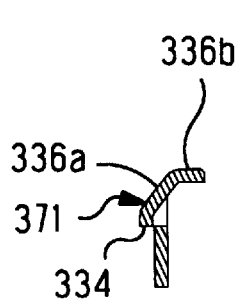
Figure 5D:
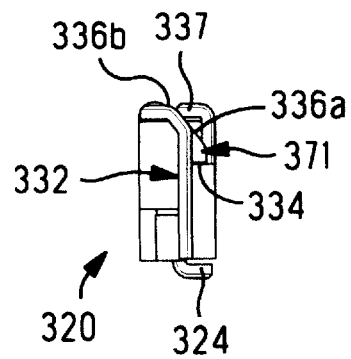

Latch member 220 of the third embodiment of FIGS. 4a–4c differs from the latch member 20 in the first embodiment in terms of the shape of the board-holding section 232, which does not have an inclined portion 36 and board-holding portion 34 of substantially equal width as in the latch member 20; instead, the inclined portion 236 extends from only a portion of the board-holding portion 234. As a result, the worker who accommodates the accommodated circuit board can remove the circuit board by operating either the inclined portion 236 or an operating portion 261 delineated by the outer edge of the board-holding portion 234. Furthermore, other members, which have the same actions as members in the first embodiment, are labeled by adding "2" to the beginning of the reference number.

Latch member 320 of the fourth embodiment of FIGS. 5a–5d also differs from the latch member 20 in the first embodiment in terms of the shape of the board-holding section 332, which includes a projecting portion 371 formed by stamping. As seen from FIG. 5c, the projecting portion 371 is positioned as a continuation of the inclined portion 336b, and it acts in conjunction with the inclined portion 336b to form another inclined portion 336a, which guides the board in the same manner as the inclined portion in the embodiments described above. Furthermore, board-holding portion 334, which prevents the accommodated circuit board from slipping out, is delineated on the bottom side of the projecting portion 371. When the accommodated circuit board is to be removed, the worker operates mainly the inclined portion 336b. Latch member 320 offers the advantage of being easily manufacturable. Furthermore, other members, which have the same actions as members in the first embodiment, are labeled by adding "3" to the beginning of the reference number.

Figure 6A:
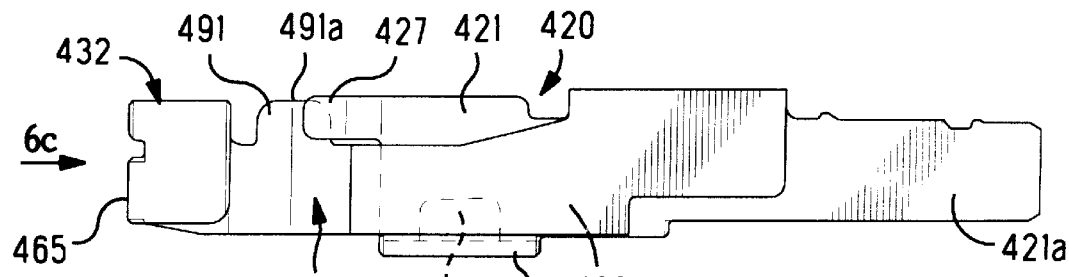
FIGS. 6a–6c illustrate an additional embodiment of the latch members of a latch-equipped connector of the present invention.
Figure 6B:
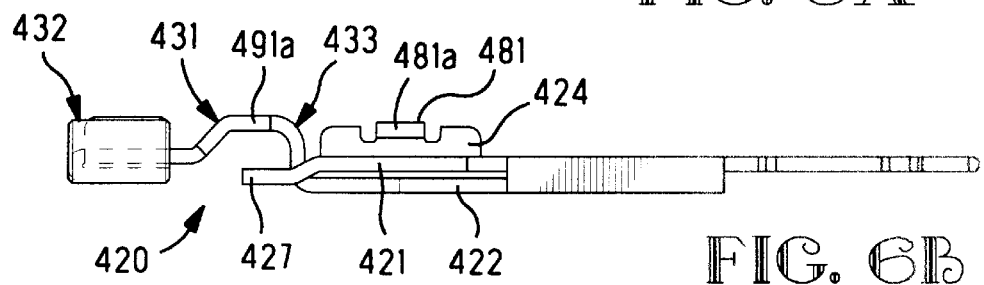
Figure 6C:
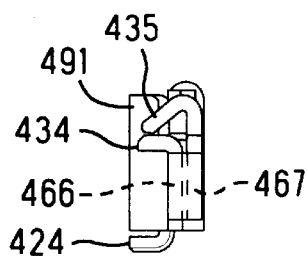

Latch member 420 of the fifth embodiment of FIGS. 6a–6c has three important differences in terms of shape compared to the latch members 20, 120, 220 and 320 in the first through fourth embodiments. These differences are important characteristic features of the latch member 420.

The first difference is in the shape of the solder-connection section 424 and the area near the solder-connection section 424. The solder-connection section 424 of the latch member 420 includes an upright portion 481, which rises upwardly from an inside edge of the solder-connection section 424. End 481a of the upright portion 481 is used as a board-positioning section which stops the accommodated circuit board from the bottom side thereof and positions the circuit board. Accordingly, this embodiment does not include a board-positioning section 26, 126, 226 or 326 formed by stamping and bending from the inner plate 21, 121, 221 or 322 as in the embodiments described above.

The second difference is the construction in the vicinity of the board-engaging section 431. The board-engaging section 431 does not include a projection on the upper end, but it has a protruding portion 491 that protrudes at the upper end thereof; top surface 491a of protruding portion 491 is positioned at the height position of the upper end of the board-holding section 432 (described later), or at a slightly higher height position. The top surface 491a forms an edge that extends in a substantially horizontal direction. As a result, in cases where the circuit board that is to be accommodated is not positioned in the correct position during the preparatory stage of accommodation, the top surface 491a engages the circuit board and prevents accommodation. As shown, a tongue 427, which is formed as an extension from the vicinity of an upper end of the inner plate 421, extends along a back surface of the protruding portion 491. The tongue 427 acts in conjunction with the protruding portion 491 to form an anti-overstress structure for the resilient arm 433.

The third difference is the construction of the area in the vicinity of the board-holding portion 432, which has a two-layer metal plate structure formed by folding back the metal plate at the front end. Holding portion 434 is formed inward from an upper end of an inside plate 466. Furthermore, an inclined portion 435 used for circuit board guidance which extends inward at an inclination is formed as an extension from an upper end of an outside plate 467. The inclined portion 435 is positioned so that it substantially overlaps with the board-holding portion 434, and so that an upper end of the inclined portion 435 engages the board-holding portion 434. As a result, the mechanical strength of the respective parts of the board-holding section 432 is increased.

Furthermore, other members in FIGS. 6a–6c, which have the same actions as members in the first embodiment, are labeled by adding "4" to the beginning of the reference number. A description of these members is omitted, since these members were described earlier.

Figure 7C:
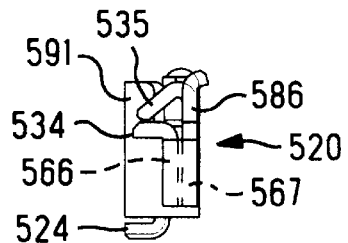
FIGS. 7a–7c illustrate a still further embodiment of the latch members of a latch-equipped connector of the present invention.
Figure 7A:
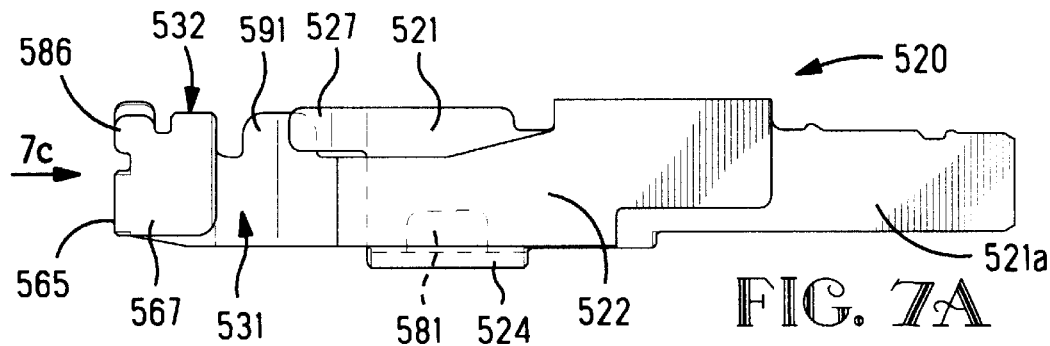
Figure 7B:
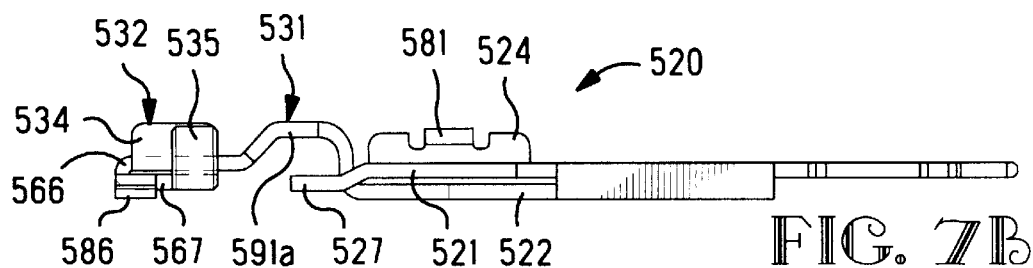

In the sixth embodiment of FIGS. 7a–7c, the shape of latch member 520 is similar to that of the latch member 420 used in the latch-equipped connector of the fifth embodiment. The board-holding section 532 of the latch member 520 also includes a two-layer metal plate structure formed by folding back the metal plate at the front end 565, and a board-holding portion 534 is provided which extends inward from an upper end of the inside plate 566; furthermore, inclined portion 535, which extends inward at an inclination is formed as an extension from an upper end of the outside plate 567. The difference from the latch member 420 of the fifth embodiment is that the inclined portion 535 does not overlap with the front surface of the board-holding portion 534, but it is instead disposed so that it overlaps only partially with the board-holding portion, and is bent slightly outward on the front side, thus forming an operating portion 586 which is constructed so that it can be engaged by the fingers. As a result, the operation of the latch member 520 by the fingers in removing the circuit board is facilitated while the mechanical strength of the board-holding section 532 is sufficiently maintained. Furthermore, other members in FIGS. 7a–7c, which have the same actions as members in the first and fifth embodiments, are labeled by adding "5" to the beginning of the reference number.

Figure 8A:
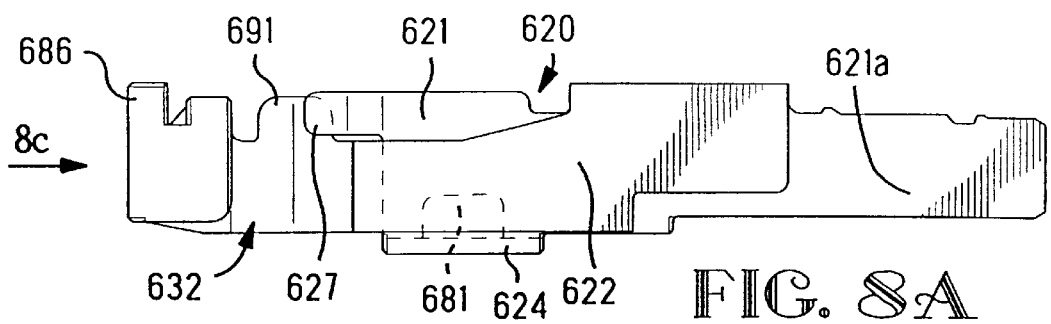
FIGS. 8a–8c illustrate still another embodiment of the latch members of a latch-equipped connector of the present invention.
Figure 8B:
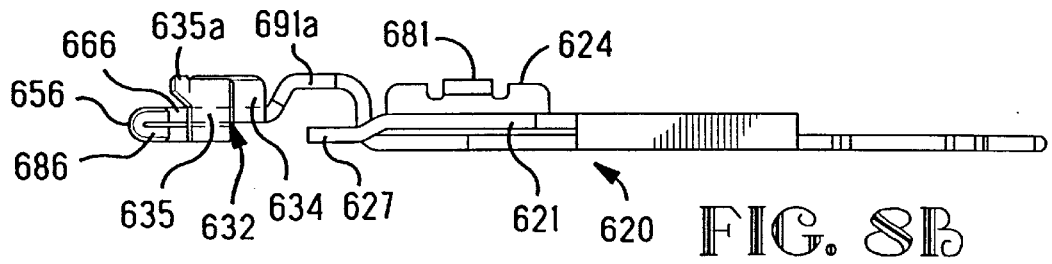
Figure 8C:
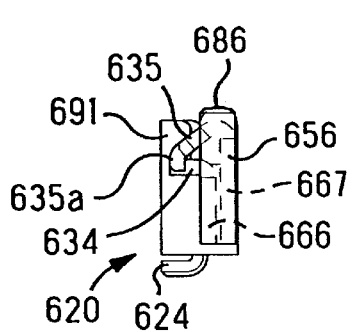

The latch member 620 of the seventh embodiment of FIGS. 8a–8c is also similar to the latch member 420 of the fifth embodiment. Here again, the difference is in the shape of the board-holding section 632, which also has a two-layer metal plate structure formed by folding back the metal plate at the front end 656; a board-holding portion 634 is provided which extends inward from an upper end of the inside plate 666, and an inclined portion 635, which extends inward at an inclination, is formed as an extension from an upper end of the outside plate 667. However, the inclined portion 635 is disposed so that it overlaps only with the front side portion of the board-holding portion 634. Furthermore, a protruding portion 635a is formed on a front end corner portion of the inclined portion 635. As a result, the mechanical strength of the board-holding section 632 is further increased. Furthermore, the area of the operating portion 686 also has a two-layer metal plate structure; accordingly, the worker can easily operate the operating portion without any danger of deformation. Furthermore, other members in FIGS. 8a–8c, which have the same actions as members in the first and fifth embodiments, are labeled by adding "6" to the beginning of the reference number.

Figure 9C:
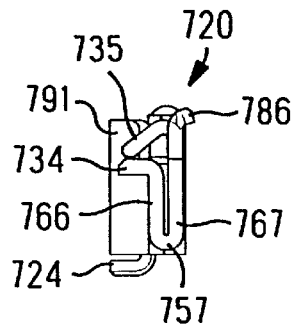
FIGS. 9a–9c illustrate still an additional embodiment of the latch members of a latch-equipped connector of the present invention.
Figure 9A:
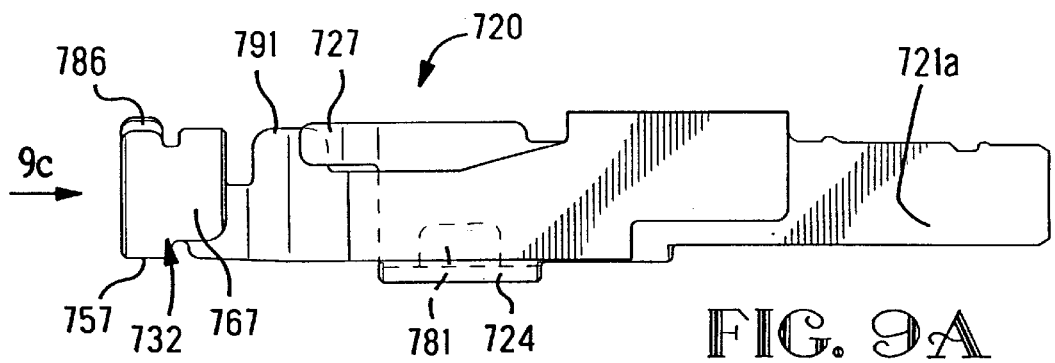
Figure 9B:
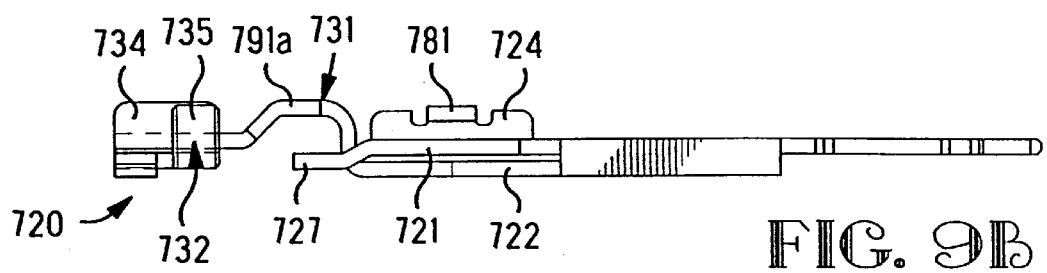

Latch member 720 of the eighth embodiment of FIGS. 9a–9c is also similar to the latch member 620 in the sixth embodiment. Here again, the difference from the latch member 520 is in the shape of the board-holding section 732. Specifically, the difference is that the two-layer metal plate structure is formed not by folding back at a front end, but rather by folding it back at a bottom end. The actions of the other members are similar to those in the first and sixth embodiments; accordingly, these members are indicated in FIGS. 9a–9c by changing the initial digits of the reference numbers to "7".

Figure 10:
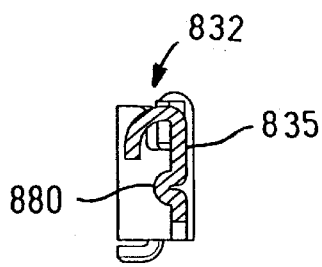
FIG. 10 is a cross-sectional view of a board-holding section illustrating a modification of the latch member.

Latch-equipped connectors constituting embodiments of the present invention have been described above. However, these are merely examples, and they do not limit the present invention; various modifications and alterations may be made by a person skilled in the art. One example of a modification is shown as a cross-sectional view of the board-holding section 832 in FIG. 10. As shown in FIG. 10, a protrusion 880, which protrudes inward, is formed in upright portion 835 of the board-holding section 832 located on the side of the circuit board; as a result, strength of the upright portion 835 is increased, and reliability with respect to the holding of the circuit board can also be increased.

The board-holding sections of the latch members of the latch-equipped connector of the present invention are positioned more toward ends of the latch members than the board-engaging sections, and they have inclined portions that are inclined substantially inward, and board-holding portions that are positioned on bottom sides of the inclined portions, and projections located at at least the height positions of the upper ends of the board-holding sections are formed on the upper ends of the board-engaging sections. Accordingly, in cases where the circuit board is not positioned in the correct position, accommodation of the circuit board is prevented, while in cases where the circuit board is positioned in the correct position, accommodation of the circuit board is smoothly performed, and the circuit board is securely held and maintained in a prescribed position. Consequently, secure accommodation of circuit boards can be guaranteed using the relatively compact connector of the present invention.

Furthermore, the board-holding sections of the latch members of the latch-equipped connector of the present invention are formed with a two-layer structure in the inward-outward direction by folding and overlapping metal plates, and they are constructed so that the board-holding sections are equipped with a board-holding portion, which extends in a substantially horizontal direction from an upper end of a first plate located on the inside, and an inclined portion, which extends at an inclination from an upper end of a second plate located on the outside toward the inside to a position which overlaps with the board-holding portion. Accordingly, the circuit board can be firmly held by a connector with relatively small dimensions. In particular, since the board-holding sections are more compact, the area required for mounting of the latch-equipped connector including the latch members can be minimized.

Furthermore, the board-positioning sections of the latch members, which determine the accommodated position of the circuit board when the circuit board is accommodated, are constructed so that the board-positioning sections extend upwardly from the solder-connecting sections of the latch members. The board-positioning sections also overlap with the solder-connection sections. Accordingly, the length dimensions of the latch members used to hold the circuit board can be minimized, so that the mounting dimensions of the latch-equipped connector can be minimized.

What is claimed is:

1. The latch-equipped electrical connector for pivotally receiving a circuit board having recesses in side edges thereof, comprising:

a housing having a board-accommodating slot in which an end of the circuit board is accommodated;

electrical contacts in the housing for electrical connection with conductive pads on the circuit board;

latch members mounted at respective ends of the housing;

board-engaging sections of the latch members engaging respective recesses in the side edges of the circuit board to properly position the circuit board relative to the connector; and board-holding sections disposed forward of the board-engaging sections toward free ends of the latch members, the board-holding sections having inclined portions being outwardly deflectable by the circuit board upon pivoting the circuit board within the connector only when the circuit board is properly positioned by the board-engaging section, the board-holding section further having board-holding portions which engage an upper surface of the circuit board thereby holding the circuit board within the connector.

2. The latch-equipped electrical connector as claimed in claim 1, wherein the latch members have inner plates and outer plates, and connecting sections connecting the inner plates and outer plates together so that they extend substantially parallel to each other.

3. The latch-equipped electrical connector as claimed in claim 2, wherein the inner plates have extensions provided with a serrated surface press-fitted into respective slots at the ends of the housing.

4. The latch-equipped electrical connector as claimed in claim 2, wherein the board-engaging sections and board-holding sections are part of the outer plates.

5. The latch-equipped electrical connector as claimed in claim 2, wherein solder-connection sections are located on the inner plates for connecting the connector to a mother board.

6. The latch-equipped electrical connector as claimed in claim 5, wherein board-positioning sections are located on the inner plates overlapping the solder-connection sections.

7. The latch-equipped electrical connector as claimed in claim 5, wherein board-positioning sections are located on said solder-connection sections.

8. The latch-equipped electrical connector as claimed in claim 2, wherein tongues on said inner plates extend along said board-engaging sections and define overstress-preventing members for the board-engaging sections.

9. The latch-equipped electrical connector as claimed in claim 2, wherein resilient arms connect the board-engaging sections to said inner plates.

10. A latch-equipped electrical connector as claimed in claim 1, wherein bottom ends of the inclined portions are located at a juncture with the board-holding portions.

11. A latch-equipped electrical connector as claimed in claim 1, wherein the inclined portions include projecting portions defining other inclined portions, bottom edges of the projecting portions define said board-holding portions.

12. The latch-equipped electrical connector as claimed in claim 10, wherein the inclined portions include projecting portions defining other inclined portions, bottom edges of the projecting portions define said board-holding portions.

13. The latch-equipped electrical connector as claimed in claim 1, wherein the board-holding sections include inside plates and outside plates.

14. The latch-equipped electrical connector as claimed in claim 13, wherein the outside plates include inclined portions.

15. The latch-equipped electrical connector as claimed in claim 13, wherein the inside plates include the board-holding portions.

16. The latch-equipped electrical connector as claimed in claim 1, wherein prevention members are located on the latch members to prevent the circuit board from being latched to the connector when the board-engaging sections mate improperly with the recesses in the side edges of the circuit board.

17. The latch-equipped electrical connector as claimed in claim 16, wherein the prevention members are located on the board-engaging sections.

18. The latch-equipped electrical connector as claimed in claim 16, wherein the prevention members are located on the board-holding sections.

19. The latch-equipped electrical connector as claimed in claim 1, wherein the board-holding portions have upright portions having protrusions therein.

20. An electrical connector for receiving a circuit board having recesses in side edges comprising:

a housing having a board-accommodating slot in which an end of the circuit board is received;

electrical contacts in the housing for contacting conductive pads on the circuit board;

latch members mounted on ends of the housing each having inner plates connected to outer plates by a connecting section;

board-engaging sections of the latch members engaging respective recesses in the side edges of the circuit board; and, board-holding sections each disposed at a location along the respective latch member which is remote from the board-engaging sections, the board-holding sections having inclined portions for engaging the circuit board as it is moved into a connected position whereby the board-holding sections are cammed outwardly by the circuit board motion.

21. The electrical connector of claim 20 wherein the inner plates have extensions disposed in slots of the housing.

22. The electrical connector of claim 20 wherein the board-engaging sections are disposed on the outer plates.

23. The electrical connector of claim 20 wherein the board-holding sections are disposed on the outer plates.

24. The electrical connector of 20 wherein solder connection sections are located on the inner plates.

25. The electrical connector of claim 24 wherein board positioning sections are located on the solder connection sections.

26. The electrical connector of claim 20 wherein tongues are disposed along the inner plate to define overstress preventing members for the board-engaging sections.

27. The electrical connector of claim 20 wherein resilient arms connect the board-engaging sections to the inner plates.

28. The electrical connector of claim 20 wherein bottom ends of the inclined portions are located at a juncture with the board-holding sections.

29. The electrical connector of claim 20 wherein the inclined portions include projection portions having bottom edges defining the board-holding sections.

30. The electrical connector of claim 20 further comprising prevention members located on the latch members to prevent circuit board latching when the board-engaging sections are improperly mated.

31. An electrical connector having a slot for receiving a circuit board comprising:

at least one latch member having a first end mounted adjacent the slot and a free end opposite the first end;

a board-engaging section being engageable with a recess on the circuit board and being disposed on the latch member between the first and free ends; and, a board-holding section disposed on the latch member between the board-engaging section and the free end wherein the board-holding section includes an inclined portion which is cammed outward by engagement with a circuit board.

32. The electrical connector of claim 31 wherein the latch member has an inner plate connected to an outer plate by a connecting section.

33. The electrical connector of claim 32 wherein the inner plate has extensions disposed in slots of the housing.

34. The electrical connector of claim 32 wherein the board-engaging section is disposed on the outer plate.

35. The electrical connector of claim 32 wherein the board-holding section is disposed on the outer plate.

36. The electrical connector of 32 wherein solder connection sections are located on the inner plate.

37. The electrical connector of claim 36 wherein board positioning sections are located on the solder connection sections.

38. The electrical connector of claim 32 wherein tongues are disposed along the inner plate to define overstress preventing members for the board-engaging sections.

39. The electrical connector of claim 31 wherein a resilient arm connects the board-engaging section to an inner plate.

40. The electrical connector of claim 31 wherein a bottom end of the inclined portion is located at a juncture with the board-holding section.

41. The electrical connector of claim 31 wherein the inclined portion includes a projecting portion having a bottom edge defining the board-holding section.

42. The electrical connector of claim 31 further comprising a prevention member located on the latch member to prevent circuit board latching when the board-engaging section is improperly mated.

* * * * *